(12) United States Patent
Yamamoto

(10) Patent No.: US 7,075,178 B2
(45) Date of Patent: Jul. 11, 2006

(54) SEMICONDUCTOR LASER

(75) Inventor: Takeshi Yamamoto, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 0 days.

(21) Appl. No.: 10/956,034

(22) Filed: Oct. 4, 2004

(65) Prior Publication Data

US 2005/0072985 A1 Apr. 7, 2005

(30) Foreign Application Priority Data

Oct. 6, 2003 (JP) ............................. 2003-347333

(51) Int. Cl.
*H01L 23/22* (2006.01)

(52) U.S. Cl. ...................... 257/687; 257/701; 257/684; 257/678; 257/99; 372/43

(58) Field of Classification Search ................ None
See application file for complete search history.

(56) References Cited

FOREIGN PATENT DOCUMENTS

| JP | 10-209551 | 8/1998 |
| JP | 10209551 A | * 8/1998 |
| JP | 2000-266969 | 9/2000 |
| JP | 2000-357839 | 12/2000 |
| JP | 2001-111152 | 4/2001 |
| JP | 2001-111154 | 4/2001 |

* cited by examiner

*Primary Examiner*—Nathan J. Flynn
*Assistant Examiner*—Scott R. Wilson
(74) *Attorney, Agent, or Firm*—Rabin & Berdo, PC

(57) ABSTRACT

A die pad and a plurality of leads are integrally held by a resin portion made of mold resin, and a laser chip is mounted on the die pad through a sub-mount. The resin portion (2) has a base portion (21) that integrally holds the plurality of leads, and has a substantially round shape in an external shape thereof, and a die pad holding portion (22) that is continuously formed above the base portion, and holds the rear surface and the side portions of the die pad. The die pad holding portion has an external shape that is included inside a circle P having a diameter that is smaller than the outer diameter of the substantially round shape of the base portion.

Consequently, it is possible to provide an optical-disk-use semiconductor laser, such as CD-use and DVD-use semiconductor laser, which has the same structure as the can-type structure and an inexpensive resin package.

13 Claims, 3 Drawing Sheets

SEMICONDUCTOR LASER

FIELD OF THE INVENTION

The present invention relates to a semiconductor laser having a small-size structure easily manufactured at low costs, which is in particular suitably applied to a pickup-use light source for use in CDs, DVDs (digital versatile disks), DVD-ROMs and data-writable CD-R/RWs. More specifically, the present invention concerns a mold-type semiconductor laser that is different from the conventional can-type semiconductor laser covered with a metal cap, achieves low costs by using resin to form a package, and has a compatible structure so that it can replace the conventional semiconductor laser without the necessity of changing the structure of an optical pickup.

BACKGROUND OF THE INVENTION

A conventional stem-type semiconductor laser to be used in a CD-use pickup and the like, which has been disclosed by, for example, Japanese Patent Application Laid-Open No. 2001-111152, has a structure as shown in FIG. 5. In other words, a metal material such as iron is formed through a cold forging method, and one portion of the center of a base 61 is raised to form a heat sink portion 62 to which leads 63 and 65 are secured through glass 66 or the like to form a stem 60, and a laser chip 71 is mounted on this heat sink portion 62 through a sub-mount 74 made of a silicon substrate and the like, with one of electrodes (on the rear side of the chip 71) being electrically connected to the lead 63 by a wire 73 through a relay portion 78 of the sub-mount 74, while the other electrode is connected to the sub-mount 74 through the wire 73, so that it is electrically connected to a common lead 64 via the heat sink portion 62 and the base 61 through the rear surface.

Here, reference numeral 72 represents a monitor-use light-receiving element one of electrodes of which is connected to the lead 65 through the wire 73, while the other electrode is electrically connected to the common lead 64 through the sub-mount 74, the heat sink portion 62 and the base 61. Further, a cap 75 is put on the periphery thereof; thus, the semiconductor laser is formed. A through hole 75a is formed in the center of the top portion of the cap 75 so that light, emitted by the laser chip 71, is transmitted through it, and a glass plate 76 is attached thereto by using an adhesive 77 so as to seal the through hole.

As described above, with respect to the conventional semiconductor laser to be used in a pickup for a CD, a DVD and the like, a package having a can-type structure in which the leads 63, 64 and 65 are secured to the metal base 61 so that the laser chip 71 is secured to the heat sink 62 connected to the base 61 has been mainly used. For this reason, this structure has good heat conduction, and also has a high airtight property with superior reliability since it is covered with the metal cap 75 on the periphery thereof; however, in this structure, since the leads 63 and 65 need to be sealingly bonded by using glass 66 or the like, the resulting problems are that it is not possible to shorten the diameter of the stem 60, that a number of parts are required and that complex manufacturing processes are required to cause high costs.

In recent years, along with the current cost reductions in electronic apparatuses including, in particular, personal computers, there have been strong demands for cost reduction also in semiconductor lasers to be used for pickups and the like. For this reason, there have been demands for improvements on the laser chip side in an attempt to improve resistance of the laser chip against external air, by using an inexpensive mold-type structure using a lead frame and a resin mold, which is completely the same structure as the conventional can-type structure.

SUMMARY OF THE INVENTION

The present invention has been devised to solve the above-mentioned problems, and its objective is to provide a semiconductor laser for use in a CD-use or DVD-use optical disk, which has not a can-type structure, but an inexpensive frame structure using a lead frame and a resin mold, and has the same structure as the conventional can-type structure so that it can replace the conventional structure, as it is.

Another objective of the present invention is to provide a semiconductor laser which, in spite of the fact that it has a characteristic in which, when molded by using a mold resin, the upper mold and the lower mold are not completely coincident with each other so that a certain face with a parting line being interpolated in between, is not completely formed into a predetermined plane, allows a laser chip to be positioned by using a face formed by the mold resin as a reference face.

Still another objective of the present invention is to provide a semiconductor laser which can accurately carry out a precise positioning process and the like required for a semiconductor laser, and also prevents corrosion or the like to the lead frame so that high characteristics can be maintained.

In accordance with the present invention, a semiconductor laser is constituted by a die pad and a plurality of leads formed by a plate-shaped lead frame, a resin portion made of a mold resin that integrally supports the die pad and the plurality of leads, and a laser chip that is mounted on one surface of the die pad, wherein the resin portion has a base portion that integrally holds the plurality of leads, with a substantially round shape in its external shape, and a die pad holding portion that is continuously formed above the base portion, and holds the rear surface and the side portions of the die pad, with an external shape that is included inside a circle having a diameter smaller than an outer diameter of the substantially round shape of the base portion. The die pad holding portion may be formed into a concave shape in a plane shape when viewed from above, which has a bottom face on the rear surface side of the die pad that is substantially flat and side portions so as to form a recessed portion at the die pad portion.

Here, the expression, "substantially round shape", means that it is not necessarily a true round shape and may be a shape close to the round shape so as to be rotated, and may include a state in which concave portions having various shapes are formed on the periphery of the round shape, or a state in which one portion of the round shape is cut out to form a flat face.

The resin portion is formed through a die molding process that is carried out with the rear surface of the lead frame serving as a parting line, and is preferably formed so that an upper surface of the base portion which is exposed without the die pad holding portion being formed thereon has a step difference between the surface side and the rear-surface side of the die pad with bordering at the parting line. Of exposed surfaces of the base portion having the step difference, only a higher upper surface of the base portion having the step difference is preferably used as a positioning reference upon mounting the laser chip and/or upon attaching the semiconductor laser to a pickup.

Surfaces of the plurality of leads and the die pad are silver-plated or 3 layers-plated made of Ni/Pd/Au, and the resin portion is formed by using super engineering plastic, more preferably, polyphthal amide or a liquid crystal polymer.

With this structure, the base portion of the mold resin is formed to have the same shape as the conventional metal base, and although the die pad holding portion used for securing the die pad is formed to have a frame shape, since this frame-shaped die-pad holding portion is formed so as to be placed within a circle having the diameter smaller than the outer diameter of the substantially round-shaped base; therefore, this shape is fitted to the conventional metal cap so that this can be dealt in the same manner as the conventional external shape with the metal cap attached thereto. In other words, in the case when, upon actually assembling the semiconductor laser in a pickup or the like, a positioning process or the like is carried out, adjustments are made while rotating the semiconductor laser, and this structure makes it possible to carry out the same rotation adjustments as the conventional can-type structure with a metal cap, and is dealt in the completely same manner.

Here, a side face (a bottom face of the concave shape) of the die pad holding portion on the die pad rear-face side is formed into a flat face; therefore, upon mounting a laser chip on the die pad, as well as upon electrically connecting the respective leads and electrodes of a laser chip or the like through wire bonding, the processes can be carried out while the flat face portion is maintained on the work bench so that the processes are easily carried out, while wire-bonding processes are carried out with high reliability. Further, the package is formed by using mold resin without using a metal base and a metal cap so that manufacturing processes other than the wire-bonding processes can also be carried out easily by using inexpensive materials, thereby making it possible to reduce costs.

Moreover, by forming a step difference with respect to the heights of the base portion upper surfaces based upon the die mold parting line, that is, for example, when the rear surface of the die pad is the parting line, by forming the resin portion so as to make the base portion upper surface on the surface side higher than the upper face on the rear-surface side, a laser-chip positioning process and a positioning process in the case of assembling it in a pickup are always carried out based upon the base portion upper surface on the die pad side serving as a reference, without receiving adverse effects from surface irregularities caused by the parting line; thus, it becomes possible to carry out an accurate positioning process while forming a package by using resin.

Furthermore, with respect to the material for the resin portion, super-engineering plastic, in particular, a polyphthalamide, a polyamide (PA; 9T nylon) or a liquid crystal polymer, is preferably used so that it is possible to provide sufficient rigidity and also to form a shape with high precision; thus, even in the case of manufacturing a semiconductor laser that requires very strict dimension and strength, it becomes possible to satisfy these requirements, and also to prevent corrosion of silver plating to be applied to the leads and die-pad surface. In the case of mounting a laser chip and the like, it also becomes possible to carry out the mounting processes with high reliability and also to prevent degradation in electric characteristics of a semiconductor laser; thus, the semiconductor laser of the present invention is desirably applied.

DETAILED DESCRIPTION

Figure 1A:
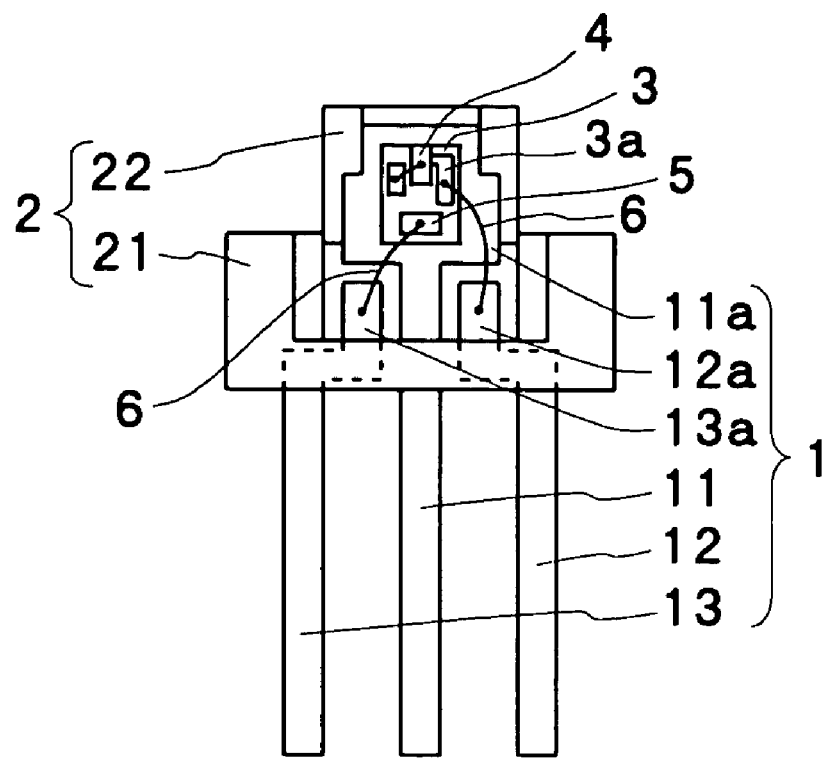
FIGS. 1A and 1B are front and plan explanatory views that show the structure of one embodiment of a semiconductor laser in accordance with the present invention.
Figure 1B:
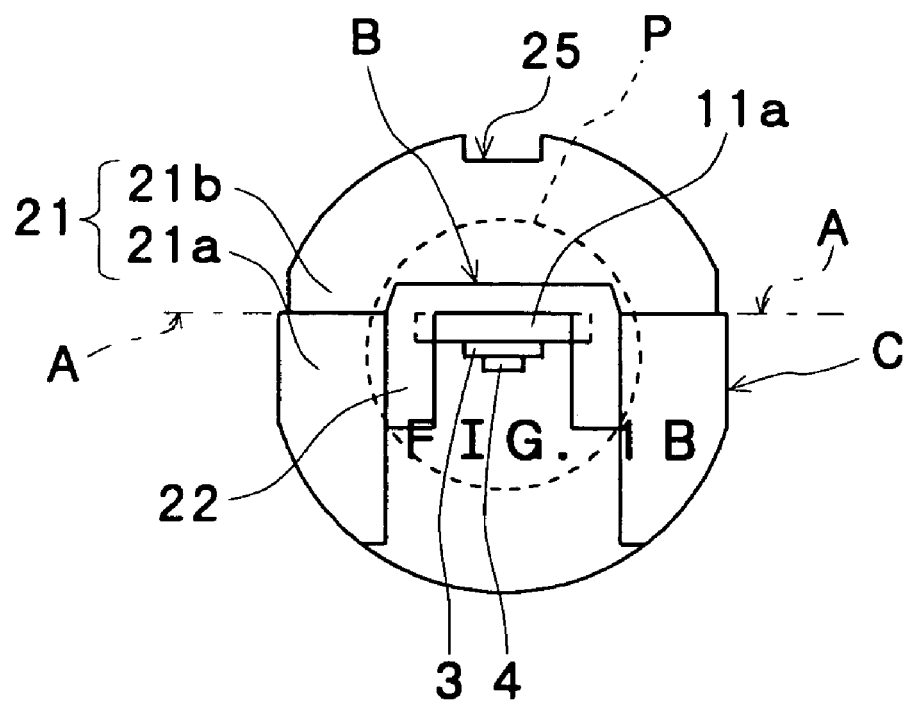

Next, referring to drawings, the following description will discuss a semiconductor laser in accordance with the present invention. As shown in FIGS. 1A and 1B that explain the front and top faces of one embodiment of a semiconductor laser in accordance with the present invention, a die pad 11a and a plurality of leads 11 to 13 formed by a plate-shaped lead frame are integrally held by a resin portion 2 made of mold resin. A laser chip 4 is mounted on one face (a surface) of the die pad 11a through a sub-mount 3. The resin portion 2 is constituted by a base portion 21 that integrally holds the plurality of leads 11 to 13 and has a substantially round shape in its external shape and a die pad holding portion 22 that is continuously formed above the base portion 21 and holds the rear surface and side portions of the die pad 11a. The die pad holding portion 22 has an external shape that is included within a circle P having a diameter smaller than the outer diameter of the base portion 21 having substantially a round shape, with a side face (a bottom face of the concave shape) B on the rear side of the die pad 11a being formed into substantially a flat face so that, when viewed from above, the die pad holding portion 22 has a concave shape with the die pad 11a in a recessed section in a plane view.

Figure 2:
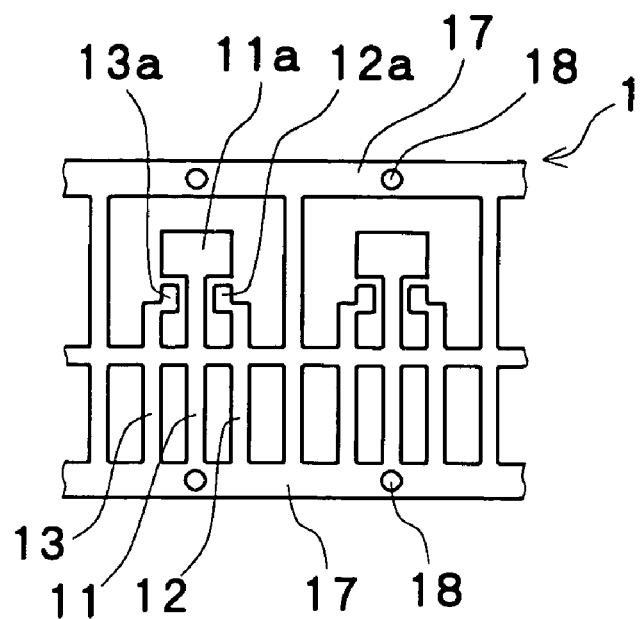
FIG. 2 is an explanatory drawing that shows a lead frame to be used in the semiconductor laser of FIG. 1.

The lead frame 1 is formed as follows; a plate member having a thickness of about 0.4 mm, made of, for example, 42 alloy, copper or copper alloy, is subjected to a stamping molding process and the like as shown in FIG. 2, and first to third leads 11 to 13 are secured to a side rail 17, with a die pad 11a being formed on the tip of the first lead 11, and wire bonding portions 12a and 13a are respectively formed on the tips of the second and third leads 12 and 13; thus, a number of such sets are connected to one another. After silver plating or 3 layers plating made of Ni/Pd/Au has been applied to the lead frame 1 with the resin portion 2 being formed thereon, the laser chip 4, etc. are assembled thereon as shown in FIG. 1A, and the respective leads 11 to 13 are cut off from the side rail 17 so that respective semiconductor lasers are separated. Here, reference numeral 18 represents an index hole.

The resin portion 2 is used for firmly securing the first to third leads 11 to 13 so as not to be individually divided even when separated from the lead frame and for positively maintaining connections between the respective electrodes of a laser chip 4 or the like and the leads 11 to 13, and formed by a resin-molding process using transfer mold and the like. In the present invention, the base portion 21 and the die pad holding portion 22 are formed so as to respectively correspond to a stem portion and a cap portion that covers the laser chip in the conventional can-package structure.

For this reason, the external shape of the base portion 21 is designed to have a shape similar to the external shape of the stem in the conventional structure, with an outer diameter of, for example, 5.6 mmφ, and a positioning-use cutout portion 25 and the like are formed on the periphery thereof in the same manner as the conventional structure. Moreover, the base portion 21 is not necessarily formed as a completely round shape (complete round) as shown in FIG. 1, and may have a flat face with a cutout portion, as indicated by C in FIG. 1B. That is, it is only necessary for the base portion 21 to have substantially a round shape in the same manner as the conventional stem so as to be rotated.

As shown in FIG. 1A, the die pad holding portion 22 extends upward from the base portion 21 in a manner so as to cover the rear surface and side portions of the die pad 11a, and the outer circumference thereof is formed so that it is allowed to enter the inside of a circle P (diameter: 3.2 mm) that corresponds to the outer diameter of the conventional metal cap, the circle P is coaxially with the outer diameter of the base portion 21, with a diameter smaller than the outer diameter thereof, while the side face B on the rear surface side of the die pad 11a is formed into a flat face. In this manner, the die pad holding portion 22 is formed so that the external shape of the die pad holding portion 22 is included within the circle P corresponding to the outer diameter of the conventional cap; thus, even when the semiconductor laser of the present invention is used in a conventional pickup device, it is possible to adjust the laser beam while being rotated, in the same manner as the conventional semiconductor laser with the can-type structure.

Moreover, since the side face B of the die pad holding portion 22 on the rear surface side of the die pad 11a is formed into a flat face, it is easily housed inside the circle P, and upon mounting the laser chip 4 and upon wire-bonding the laser chip 4 and the leads 12 and 13, it is possible to firmly secure the die pad 11a and consequently to carry out assembling processes easily.

Figure 3:
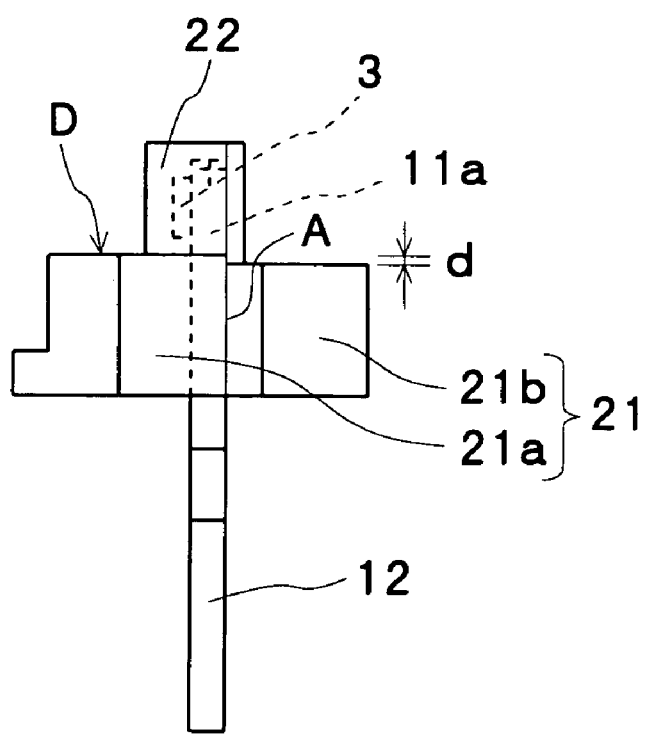
FIG. 3, which is a side view of the semiconductor laser shown in FIG. 1, shows a step difference between an upper-mold base portion and a lower-mold base portion in an exaggerated manner.

As described above, since the resin portion 2 is formed by pouring resin with the lead frame 1 being secured by a die, the border face (parting line) between the upper and the lower dies of the die is set on the lead frame, that is, on the surface of the die pad 11a (surface on which the laser chip is mounted) or on the rear surface thereof. In the example shown in FIG. 1, the parting line A is formed on the rear surface of the die pad 11a with the rear-face of the die pad 11a being set as the dividing face of the die; however, in the present invention, as indicated by a side-face view in FIG. 3, the base portion 21 is molded so that a step difference d of about 0.1 mm is provided between the upper-mold base portion (base portion on the lead frame surface side) 21a and the lower-mold base portion (base portion on the lead frame rear-surface side) 22b at a portion of the parting line A on the upper surface D (surface on the side the die pad holding portion 22 is extended) of the base portion 21. The step difference of about 0.1 mm makes it possible to always maintain the upper face D (see FIG. 3) of the upper-mold base portion 21a higher without causing a reversed state, even when a tolerance of about 0.05 mm is taken into consideration.

In other words, when the resin molding process is carried out with the upper die and the lower die being made face to face with each other, a fine deviation tends to occur between cavities during a superposing process, with the result that the base-portion upper face derived from the upper die and the base-portion upper face derived from the lower die are not formed into complete flat faces, causing a step difference and protrusions formed on the joint faces. Since the semiconductor laser having the conventional can-type structure has a stem formed by a metal plate, no problem is raised with its flatness, and the stem is used as a reference face for positioning or the like upon mounting the laser chip or upon assembling it in a pickup; however, when the package is formed by mold resin, a problem of deviations on the reference surface tends to occur due to this problem with the parting line.

Therefore, in the present invention, the position of upper face D of the base portion 21 is intentionally made different between the upper mold and the lower mold in such a manner that the base portion 21 is preferably formed so that the upper face D of the upper-mold base portion 21a on the die-pad surface side is kept higher than the upper face of the lower-mold base portion 21b by the above-mentioned length d. Here, the side that is kept higher is not necessarily the surface side of the die pad, and may be the rear-surface side, as long as a step difference is prepared.

Furthermore, the present invention features that the resin portion 2 is made from super-engineering plastic, more specifically, a material such as a polyphthal amide (PPA), a polyamide (PA; 9T nylon) or a liquid crystal polymer (LCP). In other words, in the case when the semiconductor laser of this type is formed by a package using mold resin, since a precise positioning process is required, it is necessary to use a thermoplastic material with sufficient rigidity so that a strict dimension-measuring process is available without causing resin burrs and the like, and deformation is not caused by an external force. From the viewpoints of such preciseness and rigidity, conventionally, polyphenylene sulfide (PPS) has been used as an inexpensive material with sufficient rigidity; however, as a result of extensive research efforts, the inventor of the present invention have found that in the case of PPS, sulfur (S) forming one component thereof tends to react with Ag in silver plating formed on the surface of the lead frame to cause discoloration of the lead frame and the subsequent degradation in the semiconductor laser characteristics (an increase in resistance of the joining face and the like).

The inventor of the present invention have subsequently found that the application of super-engineering plastic, such as PPA and LCP, makes it possible to form a precise package without causing degradation in the characteristics of the semiconductor laser. In other words, in an attempt to form a semiconductor laser that requires a precise package to be used for a pickup by using a package using a lead frame with silver plating applied thereto and mold resin, the application of normal materials causes problems with reliability; however, the application of super-engineering plastic as the resin material makes it possible to provide a semiconductor laser with high characteristics without causing the above-mentioned problems.

The laser chip 4 is formed so as to have a normal double-hetero structure made from, for example, an AlGaAs-based or InGaAlP-based compound semiconductor, and has a size of about 250 μm×250 μm in the case of a CD-use model, a size of about 250 μm×500 μm in the case of a DVD-use model, and a size of about 250 μm×800 μm the case of a CD-R/RW-use model. These sizes are very small, and in order to further provide easiness in handling and ensure a heat-radiating property, the laser chip is normally bonded to a sub-mount 3 that has a size of about 0.8 mm×1 mm, and is made of a silicon substrate, an AlN (alumina nitride) substrate, or the like. Further, as shown in FIG. 1A, one of the electrodes, which is connected to the sub-mount 3 through wire-bonding using a gold wire 6 or the like, is connected to the first lead 11 from the rear surface thereof through the die pad 11a by using a conductive adhesive or the like, with the other electrode (rear-surface electrode) being connected to the second lead 12 via a connecting portion 3a on the sub-mount 3 through wire bonding by using a gold wire 6 or the like.

Moreover, a light-receiving element 5, which is used for monitoring the light-emitting power of the laser chip 4, is placed on the sub-mount 3 in the same manner, and one of the electrodes is connected to the first lead 11 through the sub-mount 3 and the die pad 11a or the like, with the other electrode being directly electrically connected to the third lead 13 through wire bonding by using a gold wire 6 or the like. Here, the light-receiving element 5 may be placed at a position different from the sub-mount 3, or the light-receiving element 5 may be omitted, if it is not necessary.

In accordance with the present invention, in a structure in which a package using a lead frame and mold resin is used, the base portion and the die pad holding portion are formed into shapes respectively corresponding to the stem and the cap of a conventional can-type structure; therefore, this structure can replace the conventional semiconductor laser of the can-type structure so as to be used as it is. In particular, the die pad holding portion is formed so as to be housed inside the diameter of the conventional cap so that, upon actually assembling the semiconductor laser in a pickup, adjustments are made while rotating the semiconductor laser in the same manner as the conventional can-type structure. Moreover, since the side face on the die-pad rear-surface side of the die pad holding portion is formed into a flat face, mounting and wire-bonding processes for a laser chip and the like can be carried out very easily, thereby making it possible to provide a bonding process with high reliability.

Moreover, in accordance with the present invention, in the structure in which the base portion is formed by mold resin, a step difference is formed by the parting line at the height of the base portion so that the base portion is formed so as to allow only one of the faces of the upper-mold base portion and the lower-mold base portion derived from the upper metal mold and the lower metal mold to serve as a reference face; therefore, it is possible to prevent deviations and irregularities on the flat face caused by the parting line, and consequently to provide a very stable reference face and preciseness that is the same as or superior to a metal-plate stem of the conventional structure.

Moreover, by using super-engineering plastic as the resin material forming the resin portion, it is possible to obtain a precise processing property and sufficient rigidity for stability against externally-applied forces, and consequently to provide a very stable semiconductor laser without causing corrosion in the lead frame due to reaction of the lead frame with silver plating or the like.

Figure 4:
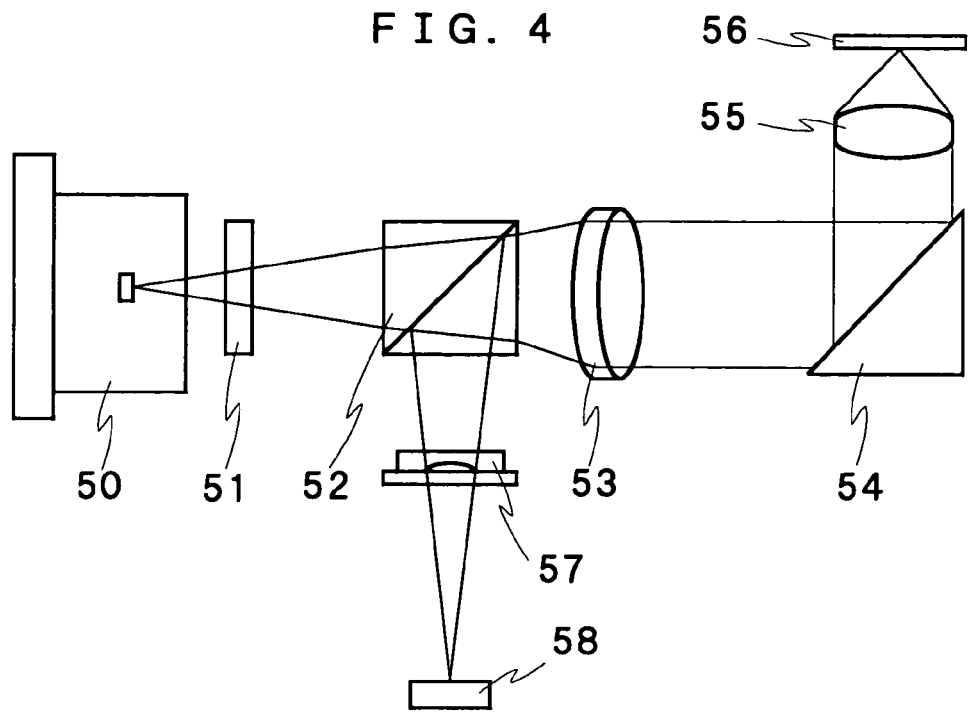
FIG. 4 is a block diagram that shows a structure in which a pickup is formed by using the semiconductor laser in accordance with the present invention.
Figure 5:
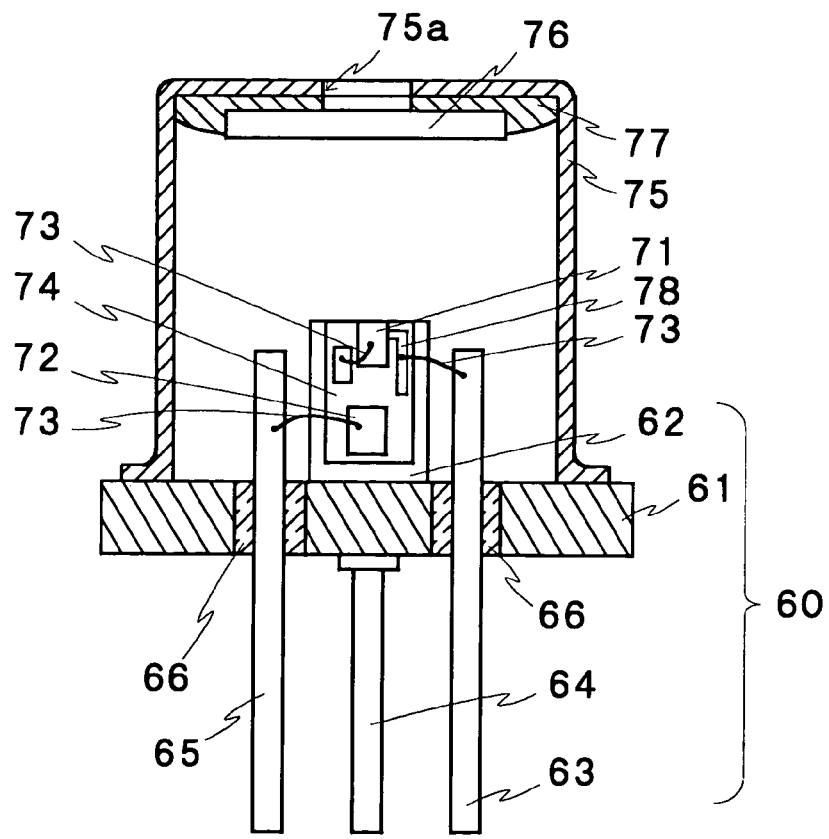
FIG. 5 is an explanatory drawing that shows a conventional semiconductor laser of a can-type structure.

FIG. 4 is an explanatory drawing that schematically shows a block diagram in which a thin pickup is formed by using this semiconductor laser. In other words, a semiconductor laser 50 is placed laterally, and light, directed from the semiconductor laser, is divided into three portions by using a diffraction grating 51 through, for example, a three-beam method, and the resulting rays are formed into parallel light beams by using a collimator lens 53 through a beam splitter 52 that separates outgoing light and reflected light; thus, the resulting parallel light beams are bent by a prism mirror (reflecting mirror) 54 by 90° (z-axis direction), and then focused on the surface of a disk 56 such as a DVD and a CD by an objective lens 55. Further, light reflected from the disk 56 is directed through a beam splitter 52, a concave lens 57, etc., to a photo-detector 58 so as to be detected.

Here, in FIG. 4, the semiconductor laser 50 and the photo-detector 58 are located substantially on the same face (xy face).

The above-mentioned description has been exemplified a one-wavelength-use structure with three leads; however, a structure with four leads on which a two-wavelength-use laser chip is mounted may be used.

Although preferred examples have been described in some detail it is to be understood that certain changes can be made by those skilled in the art without departing from the spirit and scope of the invention as defined by the appended claims.

What is claimed is:

1. A semiconductor laser comprising:
   a die pad and a plurality of leads formed by a plate-shaped lead frame;
   a resin portion, made of a mold resin, that integrally supports the die pad and the plurality of leads; and
   a laser chip that is mounted on one surface of the die pad,
   wherein the resin portion has a base portion that integrally holds the plurality of leads, and has a substantially round shape in an external shape thereof, and a die pad holding portion that is continuously formed above the base portion, and holds a rear surface and side portions of the die pad, and has an external shape that is included inside a circle having a diameter smaller than an outer diameter of the substantially round shape of the base portion;
   wherein the resin portion is formed through a die molding process that is carried out with one face of the lead frame serving as a parting line, and is formed so that an upper surface of the base portion, which is exposed without the die pad holding portion being formed thereon, has a step difference between a surface side and a rear-surface side of the die pad which border at the parting line.

2. The semiconductor laser according to claim 1, wherein only a higher upper surface of the exposed surfaces of the base portion having the step difference is used as a positioning reference upon mounting the laser chip and/or upon attaching the semiconductor laser to a pickup.

3. The semiconductor laser according to claim 2, wherein the parting line is formed on the rear surface of the lead frame, and the upper surface of the base portion on the surface side of the lead frame is used as the positioning reference.

4. The semiconductor laser according to claim 1, wherein the die pad holding portion is formed into a concave shape in a plane when viewed from above, which has a bottom face on the rear surface side of the die pad that is substantially flat and side portions so as to form a recessed portion at the die pad portion.

5. The semiconductor laser according to claim 1, wherein a positioning-use cutout portion is formed on the periphery of the base portion.

6. The semiconductor laser according to claim 1, wherein surfaces of the plurality of leads and the die pad are silver-plated or triple layer-plated with Ni/Pd/Au, and the resin portion comprises super engineering plastic.

7. The semiconductor laser according to claim 6, wherein the super engineering plastic is a polyphthal amide or a polyamide (PA) a liquid crystal polymer.

8. A semiconductor laser comprising:
   a die pad and a plurality of leads formed by a plate-shaped lead frame;
   a resin portion, made of a mold resin, that integrally supports the die pad and the plurality of leads; and a laser chip that is mounted on one surface of the die pad, wherein the resin portion has a base portion that integrally holds the plurality of leads, and has a substantially round shape in an external shape thereof, and a die pad holding portion that is continuously formed above the base portion, and holds a rear surface and side portions of the die pad, and has an external shape that is included inside a circle having a diameter smaller than an outer diameter of the substantially round shape of the base portion;

wherein surfaces of the plurality of leads and the die pad are silver-plated or triple layer-plated with Ni/Pd/Au, and the resin portion comprises super engineering plastic.

9. The semiconductor laser according to claim 8,
wherein the resin portion is formed through a die molding process that is carried out with one face of the lead frame serving as a parting line, and is formed so that an upper surface of the base portion, which is exposed without the die pad holding portion being farmed thereon, has a step difference between a surface side and a rear-surface side of the die pad which border at the parting line, and wherein only a higher upper surface of the exposed surfaces of the base portion having the step difference is used as a positioning reference upon mounting the laser chip and/or upon attaching the semiconductor laser to a pickup.

10. The semiconductor laser according to claim 9, wherein the parting line is formed on the rear surface of the lead frame, and the upper surface of the base portion on the surface side of the lead frame is used as the positioning reference.

11. The semiconductor laser according to claim 8, wherein the die pad holding portion is formed into a concave shape in a plane when viewed from above, which has a bottom face on the rear surface side of the die pad that is substantially flat and side portions so as to form a recessed portion at the die pad portion.

12. The semiconductor laser according to claim 8, wherein a positioning-use cutout portion is formed on the periphery of the base portion.

13. The semiconductor laser according to claim 8, wherein the super engineering plastic is a polyphthal amide or a polyamide (PA) a liquid crystal polymer.

* * * * *